United States Patent [19]

Pande et al.

[11] Patent Number: 5,683,936
[45] Date of Patent: Nov. 4, 1997

[54] REACTIVE ION ETCHED ASSISTED GOLD POST PROCESS

[75] Inventors: Krishna Pande, Gaithersburg; Olaleye A. Aina, Columbia; Orlando E. Asuncion, Baltimore; Fred R. Phelleps, Gaithersburg; Jay Mathews, Mt. Airy, all of Md.; Richard Dean, Bloomington,, Minn.

[73] Assignee: The Whitaker Corporation, Wilmington, Del.

[21] Appl. No.: 380,163

[22] Filed: Jan. 27, 1995

[51] Int. Cl.$^6$ .................. H01L 21/441; H01L 21/445
[52] U.S. Cl. .................. 437/184; 437/187; 437/203; 148/DIG. 106
[58] Field of Search .................. 437/184, 203, 437/187, 229; 148/DIG. 106; 156/659.11

[56] References Cited

U.S. PATENT DOCUMENTS

| | | | |
|---|---|---|---|
| 4,401,367 | 8/1983 | Grantham et al. | |
| 4,782,032 | 11/1988 | Geissberger et al. | 437/41 |
| 4,832,761 | 5/1989 | Geisberger et al. | 148/33.3 |
| 4,847,212 | 7/1989 | Balzan et al. | 437/41 |
| 4,849,376 | 7/1989 | Balzan et al. | 437/228 |
| 4,897,361 | 1/1990 | Harriot et al. | 437/24 |
| 4,965,218 | 10/1990 | Geissberger et al. | 437/41 |
| 4,988,413 | 1/1991 | Chakravorty et al. | 204/15 |
| 5,063,655 | 11/1991 | Lamey et al. | 29/611 |
| 5,137,597 | 8/1992 | Curry, II et al. | 156/636.1 |
| 5,162,078 | 11/1992 | Bley et al. | 205/75 |
| 5,185,292 | 2/1993 | VanVonno et al. | 437/180 |
| 5,270,261 | 12/1993 | Bertin et al. | 437/209 |

*Primary Examiner*—Jey Tsai
*Assistant Examiner*—C. Everhart

[57] ABSTRACT

A process to fabricate a specified height and cross-section of Microwave Monolithic Integrated Circuit gold posts comprising a patterned conductive substrate overlayed by an adhesive layer, a matrix layer, and a photoresist layer. Using photolithographic techniques, gold post locations are defined in the photoresist layer. m Gold post locations and cross-sections are defined in the matrix layer. The adhesive layer at the gold post locations is removed. The gold post locations are plated to form gold posts. The matrix is etched and the adhesive is dissolved.

5 Claims, 3 Drawing Sheets

REACTIVE ION ETCHED ASSISTED GOLD POST PROCESS

The purpose of the invention is to provide a means of fabricating gold posts of a desired cross section and a desired height. The posts serve as conductors and spacers for Microwave Monolithic Integrated Circuits (MMIC). Conductor length is minimized, inductance is better controlled and backside processing is simplified. Wafer thinning can be eliminated as can through the wafer vias.

An objective of the invention is to improve high frequency MMIC performance and utilize three dimensional packaging to reduce system size. This objective is accomplished by enabling designers to take advantage of the low dielectric constant of air, selective ground plane placement, low inductance grounding, low loss transmission lines and off-chip coupling. Designers have found that gold posts on microwave circuits accomplish this objective. Gold posts permit flip-chip mounting to hybrid microwave circuits. This mounting technique eliminates bond wires by replacing them with well defined conductive paths and controlling circuit inductance.

Microwave monolithic integrated circuits are finding significant usage in commercial satellites and defense systems, e.g., communications and smart munitions.

Packaging is one of the major costs in the manufacturing of MMIC components. Efforts are being directed to develop multi-chip module technology which can be produced at lower cost.

A multi-chip module package should allow not only smaller size and higher component integration but also lower loss while keeping the cost of the assembly low.

Packaging which incorporates gold post technology has many merits. Such packaging allows three dimensional integration thus reducing the size of the microwave components housing. It further reduces MMIC fabrication cost by eliminating backside processing. It allows interconnection of several MMIC components on a motherboard, thereby reducing cost while giving low loss performance. Bias network capability with such packaging is possible on a separate motherboard which can be integrated with MMIC chips leading to three dimensional capability for multi-chip module, such as a 47 GHz power amplifier gold post assembly. Another packaging merit is the use of low loss inverted microstrip transmission lines and off-chip coupling for input and output signals. This packaging also allows network designs with coplanar waveguides or balanced transmission lines. Lastly, this packaging method provides an efficient heat sink through gold posts, low inductance ground through gold posts, while improving dependability with the elimination of wire bonding, and reducing parasitics.

The prior art method provides smaller height gold posts which are fabricated and limited to the height of thick polyimide films. The entailed thick photosensitive polyimide films are patterned with vias in which the gold posts are plated. This method fails to obtain uniform polyimide films greater than thirty microns thick. Thick polyimide forms a bead at the edge of the substrate and the bead causes mask substrate separation during exposure. Light scattering results in ill-defined vias. Gold post height is determined by plating thickness and is not greater than the polyimide thickness.

The problem to be solved is a means to fabricate a microwave monolithic integrated circuit's gold posts having specified heights and cross-sections not pre-determined by the limitations of films. Another problem this invention solves is fabricating gold posts of greater than ten microns in height, preferably as high as 150 microns.

SUMMARY OF THE INVENTION

The invention is a process which includes bonding a matrix which can be mechanically lapped or thinned and reactive-ion-etched through the matrix to a patterned substrate upon which the gold posts are to be plated. The adhesive, matrix, and patterned substrate, is bonded to a lapping support disk. The matrix is lapped to a thickness near but greater than the desired post height. Using semiconductor photolithographic techniques, the gold post locations are defined. Gold post location vias or holes through the matrix are reactive-ion-etched. The gold posts are plated to a thickness equal to or greater than the thickness of the matrix. The component comprising the matrix and plated gold posts is lapped to the desired post height. The matrix is disabled or chemically removed exposing the gold posts. The gold post substrate is demounted from the lapping support disk and diced. The die can then be parallel mounted via the gold posts to a complimentary circuit.

The above and other objects, features, and advantages of the present invention will become more apparent from the following detailed description taken in conjunction with the accompanying drawings.

BRIEF DESCRIPTION OF THE DRAWINGS

An embodiment of the invention will now be described by way of example with reference to the accompanying drawings, according to which.

1A illustrates the support disk for lapping operation overlayed by a substrate which is overlayed by an adhesive that is overlayed by a matrix, 1B illustrates the photoresist overlaying

DETAILED DESCRIPTION OF THE INVENTION

Figure 1A:
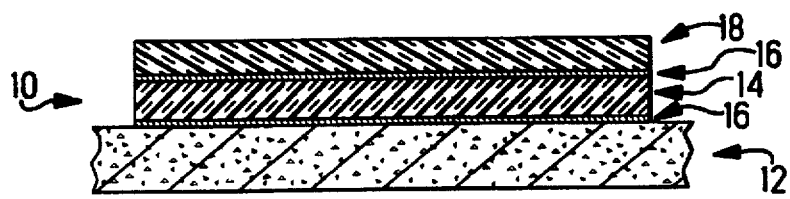
FIG. 1A, 1C illustrates the gold post locations formed, 1D illustrates the stripping of the photoresist layer and dissolving of the adhesive located at the gold post locations, 1E illustrates the plating of the gold posts, 1F illustrates the removal of the matrix, 1G illustrates the dissolving of the remaining adhesive.
Figure 1B:
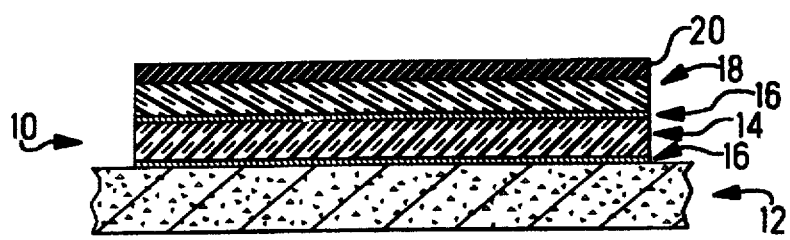
FIG. 1 is a schematic drawing of the method.
Figure 1C:
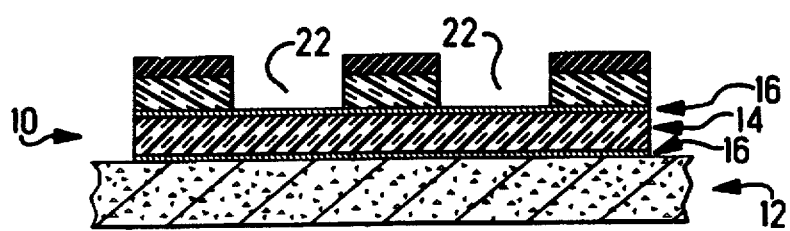
Figure 1D:
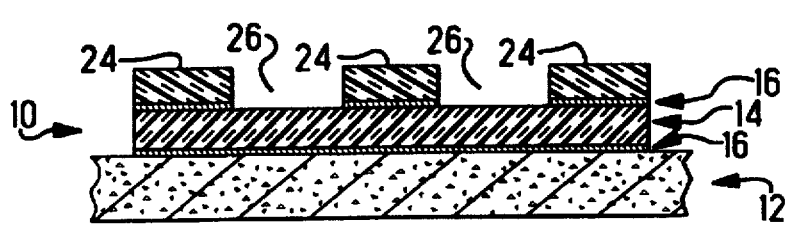
Figure 1E:
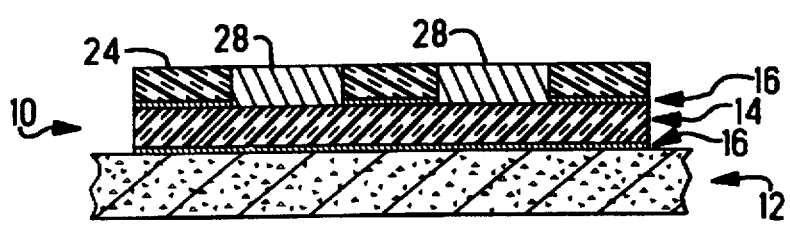
Figure 1F:
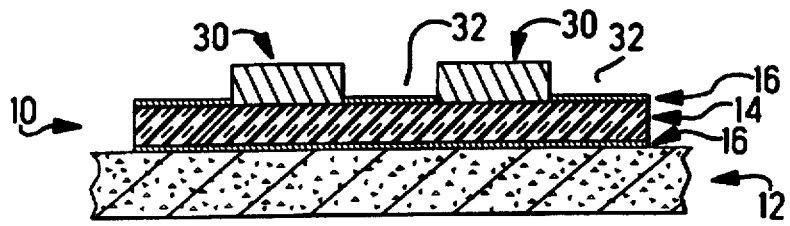
Figure 1G:
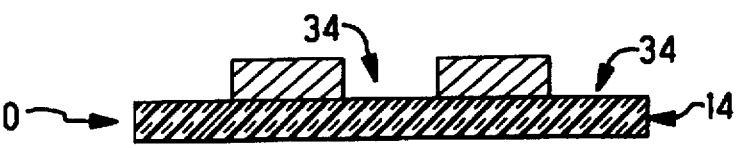
Figure 4:
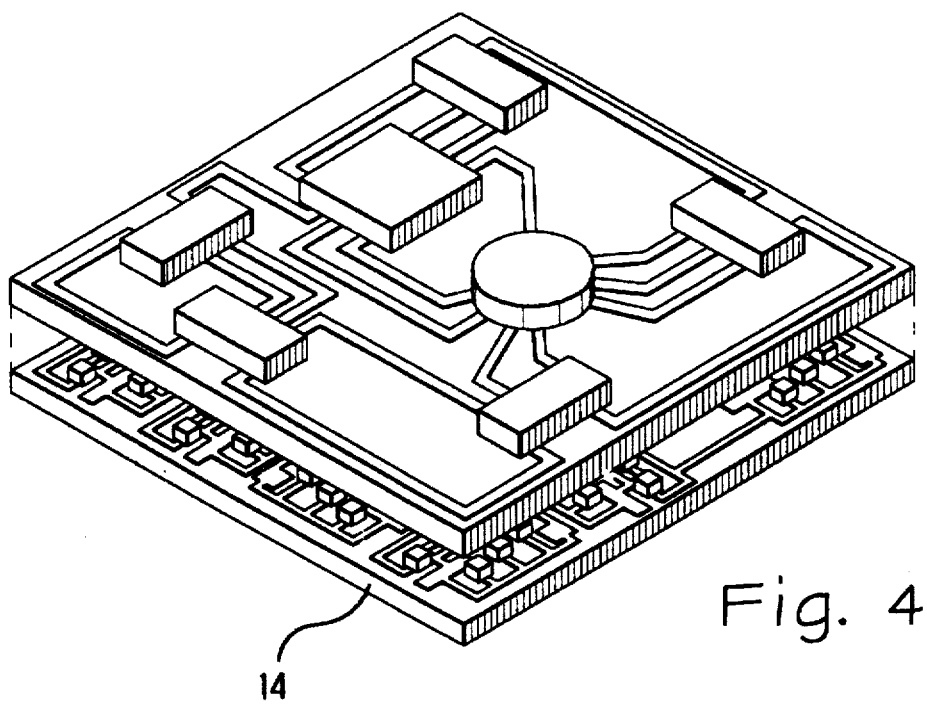
FIG. 4 illustrates encasing of FIG. 3.

A fused silica substrate (14) which can also be aluminum, silicon, or sapphire illustrated in FIG. 1, is patterned with transmission lines, gold post locations, coupler pads and possible other features, e.g., selectively placed ground planes. The patterned substrate must be conductive in order to plate the gold posts. A thin gold surface (not shown) on the substrate is used to provide continuity for electroplating, and is later removed as described hereinafter. The substrate is sandwiched with an adhesive layer (16) between a lapping support disk (12) and a GaAs matrix wafer (18). The adhesive layer (16) is a resin type material like Novolak® resin that has a low etch rate during reactive ion etching of the matrix. The matrix (18) overlays the patterned substrate (14). The matrix (18) is chosen because it can be lapped to a desired thickness, reactive-ion-etched, and can serve as a mask in a gold plating bath.

The matrix (18) is lapped to a desired thickness. A photoresist layer (20) is applied. Using photolithographic methods, gold post locations to be etched in the matrix (18) are defined in the photoresist layer (20).

The gold post location holes (22) in which the gold posts are to be plated are reactive-ion-etched. The defined photoresist layer and defined matrix layer areas are removed.

The undefined photoresist, which remains, is stripped (24) and the adhesive layer (16) where the gold posts are to be plated is dissolved (26). The adhesive composite is dissolved in a two step process. The first step is to apply a solvent such as isopropanol alcohol which dissolves the adhesive layer material. The last step requires removing any remaining solvent in the hole, this can occur by drying. The gold posts are then plated (28).

The matrix (18) and gold posts (28) are lapped to the final gold post height correcting any non-uniformities that might arise during plating. The tops of the gold posts may be tinned (30), e.g., with evaporated or plated tin or indium to facilitate bonding to a complimentary circuit.

The remaining matrix is etched (32). The remaining adhesive layer (16) is dissolved as set forth above (34) and the thin gold conductive surface (not shown) on the substrate, used to provide continuity for electro-plating, is removed by sputter etching.

Figure 2:
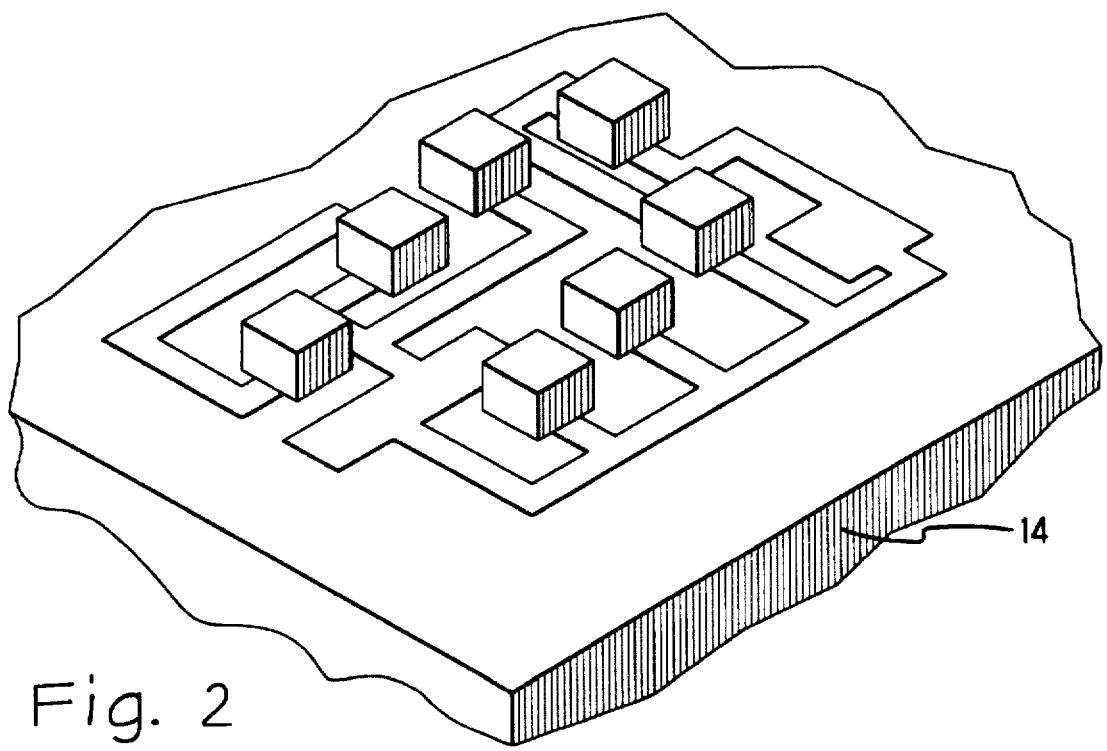
FIG. 2 is a schematic drawing of the present invention.
Figure 3:
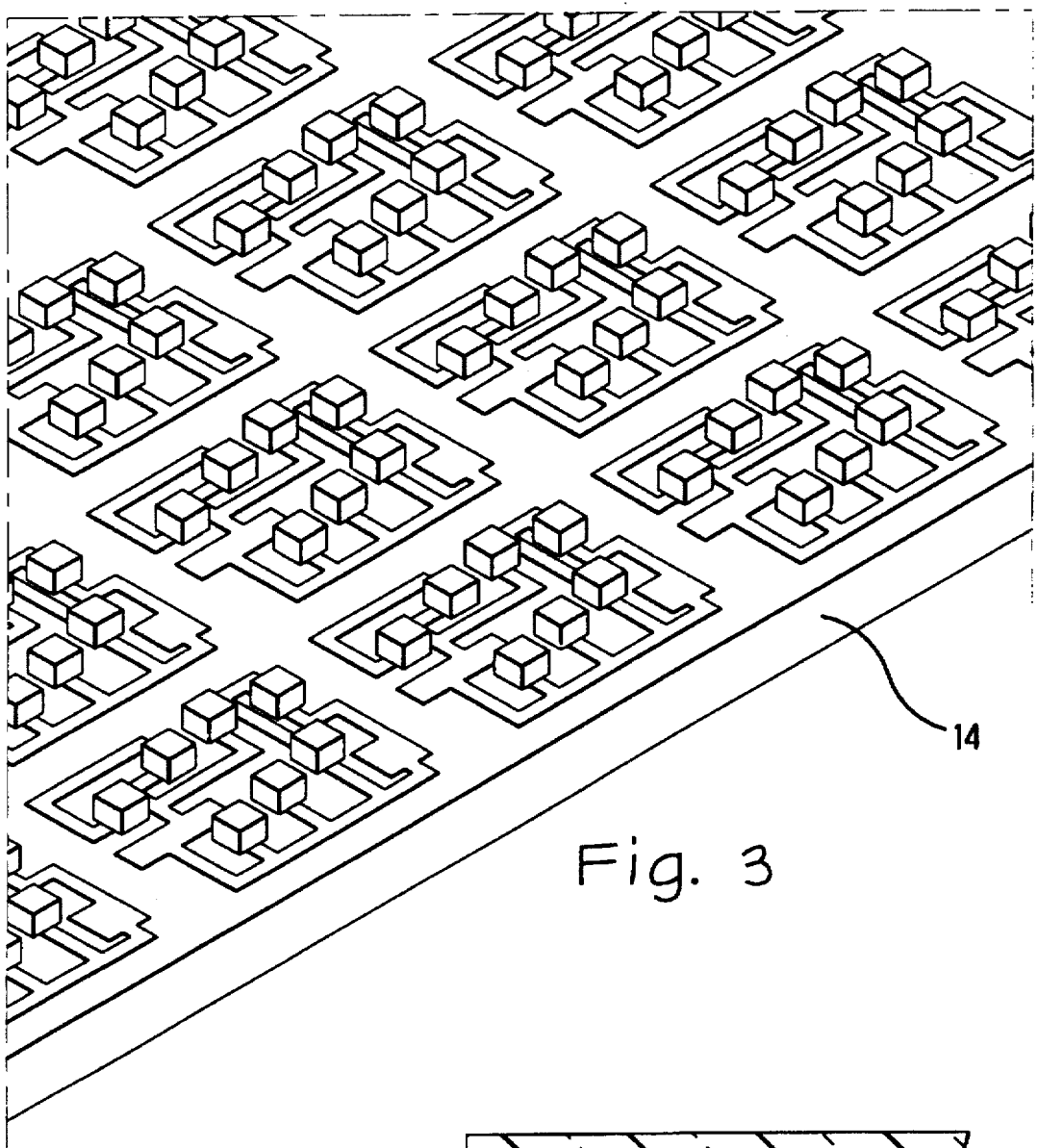
FIG. 3 is an enclosed drawing of FIG. 2.
Figure 5:
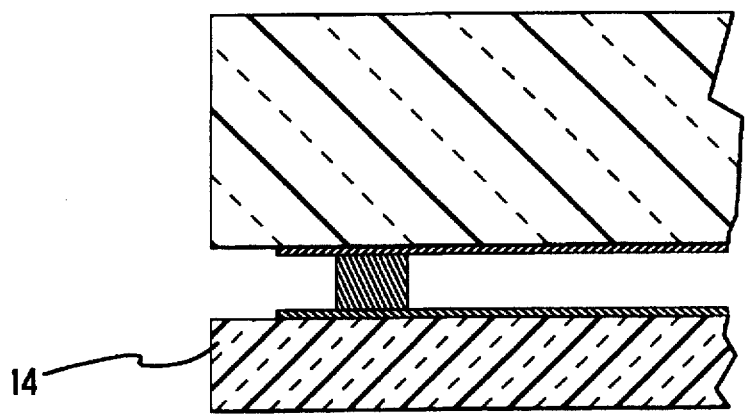
FIG. 5 illustrates a side view of FIG. 4.

The gold post substrate (40) is demounted from the support disk (FIG. 2) and mechanically diced to separate the die. The packaged module is formed by mating the MMIC and gold post die by aligning the position and then heating the solder for attachment. The die are mounted parallel to complimentary circuits by aligning and heating.

The gold post process was utilized in the packaging of 47 GHz power amplifiers. A packaged power amplifier chip using a gold post die is shown in photograph 4. Fused silica was used for the bias network and the chip is mounted to the posts on the fused silica. This technique is applicable to three dimensional packaging for millimeter wave phased array interconnections, millimeter wave components for radios and multichip module interconnect packaging New features of this invention include 1) gold posts fabricated to a specified height and cross-section, 2) gold posts lapped to a specified height, and 3) the invention employs reactive-ion-etched vias in which straight-wall gold posts are plated.

There has been shown and described a novel process to fabricate microwave monolithic integrated circuit gold posts that have a specified height and cross-length not predetermined by photolithography film limitations. Many changes, modifications, variations, and other uses and applications of the subject invention will, however, become apparent to those skilled in the art after considering the specification and the accompanying drawings which disclose preferred embodiments thereof. All such changes, modifications, variations, and other uses and applications which do not depart from the spirit and scope of the invention are deemed to be covered by the invention which is limited only by the claims which follow.

The invention claimed is:

1. A method of making gold posts suitable for a microwave monolithic circuit, comprising the steps of:

applying a conducting surface on an insulating substrate to provide continuity for plating, overlying the conducting surface with a semiconductor material having a desired thickness, applying a photoresist onto the semiconductor material, defining holes at respective locations through the photoresist and the semiconductor material by photolithography followed by etching to remove the semiconductor material, plating gold in the holes to create posts of desired height, and removing the semiconductor material and the conducting surface on the substrate which surround the posts, leaving the posts directly on the substrate.

2. A method as recited in claim 1, and further comprising the step of:

applying gold to the substrate to create the conducting surface, whereby, the conducting surface and the posts are the same metal.

3. A method as recited in claim 1, and further comprising the step of:

applying an adhesive between the semiconductor material and the conducting surface, and removing the adhesive from the holes.

4. A method as recited in claim 1, and further comprising the step of:

lapping the posts in the holes and the semiconductor material to a desired height whereby the height of the posts is accurately controlled.

5. A method as recited in claim 1, and further comprising the step of:

applying a conductive material to the posts before removing the semiconductor material and the conducting surface which surround the post.

* * * * *